(12) United States Patent
Krasnov

(10) Patent No.: US 8,936,842 B2
(45) Date of Patent: Jan. 20, 2015

(54) LOW-E COATING HAVING ZINC ALUMINUM OXIDE BASED LAYER DOPED WITH YTTRIUM

(71) Applicant: Guardian Industries Corp., Auburn Hills, MI (US)

(72) Inventor: Alexey Krasnov, Canton, MI (US)

(73) Assignee: Guardian Industris Corp., Auburn Hills, MI (US)

( * ) Notice: Subject to any disclaimer, the term of this patent is extended or adjusted under 35 U.S.C. 154(b) by 0 days.

(21) Appl. No.: 13/678,777

(22) Filed: Nov. 16, 2012

(65) Prior Publication Data

US 2013/0074922 A1    Mar. 28, 2013

Related U.S. Application Data

(62) Division of application No. 11/650,564, filed on Jan. 8, 2007, now Pat. No. 8,334,452.

(51) Int. Cl.
*C03C 17/36* (2006.01)
*H01L 31/0224* (2006.01)
*C01G 9/00* (2006.01)
(Continued)

(52) U.S. Cl.
CPC ........ *H01L 31/022425* (2013.01); *C03C 17/36* (2013.01); *C01G 9/00* (2013.01); *C01G 9/02* (2013.01); *H01L 31/022466* (2013.01); *H01L 31/1884* (2013.01); *G02B 5/0816* (2013.01);
(Continued)

(58) Field of Classification Search
CPC .............. C03C 17/3618; C03C 17/366; C03C 2217/216; C03C 2217/24; C03C 2217/242; C03C 17/3423; C03C 17/3681; C03C 2217/228; Y10S 428/913
USPC ................ 428/626, 702; 204/192.29, 298.13; 136/256
See application file for complete search history.

(56) References Cited

U.S. PATENT DOCUMENTS 3,411,934 A    11/1968 Englehart et al.
4,155,781 A    5/1979 Diepers
(Continued)

FOREIGN PATENT DOCUMENTS

DE    19713215    8/1998
DE    19958878    6/2001
(Continued)

OTHER PUBLICATIONS

U.S. Appl. No. 11/650,564, filed Jan. 8, 2007; Krasnov.
(Continued)

*Primary Examiner* — Jayne Mershon
(74) *Attorney, Agent, or Firm* — Nixon & Vanderhye P.C.

(57) ABSTRACT

Certain example embodiments of this invention relate to an electrode (e.g., front electrode) for use in a photovoltaic device or the like. In certain example embodiments, a transparent conductive oxide (TCO) based front electrode for use in a photovoltaic device is of or includes zinc oxide, or zinc aluminum oxide, doped with yttrium (Y). In certain example embodiments, the addition of the yttrium (Y) to the conductive zinc oxide or zinc aluminum oxide is advantageous in that potential conductivity loss of the electrode can be reduced or prevented. In other example embodiments, a low-E coating may include a layer of or including zinc oxide, or zinc aluminum oxide, doped with yttrium (Y).

7 Claims, 2 Drawing Sheets

(51) Int. Cl.
   *C01G 9/02* (2006.01)
   *H01L 31/18* (2006.01)
   *G02B 5/08* (2006.01)
(52) U.S. Cl.
   CPC ......... *C01P 2002/52* (2013.01); *C01P 2006/40* (2013.01); *Y02E 10/50* (2013.01)
   USPC .............................. 428/34; 428/428; 428/434

(56) References Cited

U.S. PATENT DOCUMENTS

| | | | |
|---|---|---|---|
| 4,162,505 A | 7/1979 | Hanak | |
| 4,163,677 A | 8/1979 | Carlson et al. | |
| 4,213,798 A | 7/1980 | Williams et al. | |
| 4,378,460 A | 3/1983 | Williams | |
| 4,532,373 A | 7/1985 | Matsuura et al. | |
| 4,554,727 A | 11/1985 | Deckman et al. | |
| 4,598,306 A | 7/1986 | Nath et al. | |
| 4,663,495 A | 5/1987 | Berman et al. | |
| 4,689,438 A | 8/1987 | Fukatsu et al. | |
| 4,940,495 A | 7/1990 | Weber et al. | |
| 5,073,451 A | 12/1991 | Iida et al. | |
| 5,091,764 A | 2/1992 | Asaoka et al. | |
| 5,110,637 A | 5/1992 | Ando et al. | |
| 5,131,954 A | 7/1992 | Vogeli et al. | |
| 5,171,411 A | 12/1992 | Hillendahl et al. | |
| 5,256,858 A | 10/1993 | Tomb | |
| 5,326,519 A | 7/1994 | Claussen | |
| 5,589,403 A | 12/1996 | Toyama et al. | |
| 5,603,778 A | 2/1997 | Sonoda | |
| 5,650,019 A | 7/1997 | Yamada et al. | |
| 5,667,853 A | 9/1997 | Fukuyoshi et al. | |
| 5,699,035 A | 12/1997 | Ito et al. | |
| 5,861,189 A | 1/1999 | Sheel et al. | |
| 5,891,556 A | 4/1999 | Anderson et al. | |
| 5,964,962 A | 10/1999 | Sannomiya et al. | |
| 6,048,621 A | 4/2000 | Gallego et al. | |
| 6,123,824 A | 9/2000 | Sano et al. | |
| 6,187,824 B1 | 2/2001 | Swank | |
| 6,288,325 B1 | 9/2001 | Jansen et al. | |
| 6,344,608 B2 | 2/2002 | Kariya et al. | |
| 6,365,823 B1 | 4/2002 | Kondo | |
| 6,406,639 B2 | 6/2002 | Sakaguchi et al. | |
| 6,433,913 B1 | 8/2002 | Bauer et al. | |
| 6,469,438 B2 | 10/2002 | Fukuoka et al. | |
| 6,506,622 B1 | 1/2003 | Shiozaki | |
| 6,596,135 B1 * | 7/2003 | Mitsui ..................... | 204/192.29 |
| 6,613,603 B1 | 9/2003 | Sano | |
| 6,627,322 B2 | 9/2003 | Choi et al. | |
| 6,686,050 B2 | 2/2004 | Lingle et al. | |
| 6,746,775 B1 | 6/2004 | Boire et al. | |
| 6,747,779 B1 | 6/2004 | Morin et al. | |
| 6,784,361 B2 | 8/2004 | Carlson et al. | |
| 6,825,409 B2 | 11/2004 | Haussler et al. | |
| 6,827,970 B2 | 12/2004 | Varanasi et al. | |
| 6,844,210 B2 | 1/2005 | Fukuoka et al. | |
| 6,852,555 B1 | 2/2005 | Roman et al. | |
| 6,933,672 B2 | 8/2005 | Hosokawa | |
| 6,936,347 B2 | 8/2005 | Laird et al. | |
| 6,963,168 B2 | 11/2005 | Eida et al. | |
| 6,963,383 B2 | 11/2005 | Tokailin et al. | |
| 6,972,750 B2 | 12/2005 | Yu | |
| 6,975,067 B2 | 12/2005 | McCormick et al. | |
| 6,979,414 B2 | 12/2005 | Hosokawa | |
| 6,987,547 B2 | 1/2006 | Yang et al. | |
| 6,989,280 B2 | 1/2006 | Ko | |
| 7,012,728 B2 | 3/2006 | Morin et al. | |
| 7,037,869 B2 | 5/2006 | Landa et al. | |
| 7,087,834 B2 | 8/2006 | McFarland | |
| 7,090,721 B2 | 8/2006 | Stachowiak | |
| 7,132,666 B2 | 11/2006 | Nakata et al. | |
| 7,141,863 B1 | 11/2006 | Compaan et al. | |
| 7,144,837 B2 | 12/2006 | Landa et al. | |
| 7,153,579 B2 | 12/2006 | Kriltz et al. | |
| 7,169,722 B2 | 1/2007 | Landa et al. | |
| 7,317,237 B2 | 1/2008 | Niira et al. | |
| 8,334,452 B2 | 12/2012 | Krasnov | |
| 2003/0011047 A1 | 1/2003 | Cunningham et al. | |
| 2003/0064255 A1 | 4/2003 | Dannenberg | |
| 2003/0143435 A1 * | 7/2003 | Schicht et al. ................ | 428/697 |
| 2003/0165693 A1 | 9/2003 | Hartig et al. | |
| 2003/0218153 A1 | 11/2003 | Abe | |
| 2004/0038051 A1 | 2/2004 | Fujisawa et al. | |
| 2004/0086723 A1 | 5/2004 | Thomsen | |
| 2004/0113146 A1 | 6/2004 | Dahmani | |
| 2004/0187914 A1 | 9/2004 | Matsuda et al. | |
| 2004/0226818 A1 * | 11/2004 | Takagi et al. ............ | 204/298.13 |
| 2004/0244829 A1 | 12/2004 | Rearick et al. | |
| 2005/0016583 A1 | 1/2005 | Blieske et al. | |
| 2005/0042460 A1 | 2/2005 | Kriltz | |
| 2005/0186482 A1 * | 8/2005 | Maschwitz ....................... | 430/1 |
| 2005/0257824 A1 | 11/2005 | Maltby et al. | |
| 2005/0258029 A1 | 11/2005 | Muller et al. | |
| 2006/0065299 A1 | 3/2006 | Fukawa et al. | |
| 2006/0099441 A1 | 5/2006 | Teyssedre et al. | |
| 2006/0105180 A1 * | 5/2006 | Schicht et al. ................ | 428/432 |
| 2006/0169316 A1 | 8/2006 | Thomsen et al. | |
| 2006/0219988 A1 | 10/2006 | Abe | |
| 2006/0228564 A1 | 10/2006 | Demiryont | |
| 2006/0248923 A1 | 11/2006 | Krasnov et al. | |
| 2006/0249199 A1 | 11/2006 | Thomsen et al. | |
| 2006/0289055 A1 | 12/2006 | Sridharan et al. | |
| 2007/0029187 A1 | 2/2007 | Krasnov | |
| 2007/0120045 A1 | 5/2007 | Yokoyama | |
| 2007/0184573 A1 | 8/2007 | Krasnov | |
| 2007/0193624 A1 | 8/2007 | Krasnov | |
| 2007/0209698 A1 | 9/2007 | Thomsen et al. | |
| 2007/0215205 A1 | 9/2007 | Thomsen et al. | |
| 2008/0047602 A1 | 2/2008 | Krasnov | |
| 2008/0047603 A1 | 2/2008 | Krasnov | |
| 2008/0105293 A1 | 5/2008 | Lu et al. | |
| 2008/0105298 A1 | 5/2008 | Lu et al. | |
| 2008/0105299 A1 | 5/2008 | Krasnov | |
| 2008/0105302 A1 | 5/2008 | Lu et al. | |
| 2008/0107799 A1 | 5/2008 | Lu et al. | |
| 2008/0169021 A1 | 7/2008 | Krasnov | |
| 2008/0178932 A1 | 7/2008 | den Boer et al. | |
| 2008/0210303 A1 | 9/2008 | Lu et al. | |
| 2008/0223430 A1 | 9/2008 | Krasnov et al. | |
| 2008/0223436 A1 | 9/2008 | den Boer et al. | |
| 2008/0302414 A1 | 12/2008 | den Boer et al. | |
| 2008/0308145 A1 | 12/2008 | Krasnov et al. | |
| 2008/0308146 A1 | 12/2008 | Krasnov et al. | |
| 2008/0308151 A1 | 12/2008 | den Boer et al. | |
| 2009/0084438 A1 | 4/2009 | den Boer et al. | |
| 2009/0126791 A1 | 5/2009 | Lu et al. | |
| 2009/0194155 A1 | 8/2009 | den Boer et al. | |
| 2009/0194157 A1 | 8/2009 | den Boer et al. | |
| 2009/0233121 A1 * | 9/2009 | Leconte ....................... | 428/626 |

FOREIGN PATENT DOCUMENTS

| | | | |
|---|---|---|---|
| EP | 0 180 222 | 5/1986 | |
| EP | 0 204 562 | 10/1986 | |
| EP | 0 204 562 | 12/1986 | |
| EP | 0 252 489 | 1/1988 | |
| EP | 0 372 929 | 6/1990 | |
| EP | 0 403 936 | 12/1990 | |
| EP | 0 436 741 | 7/1991 | |
| EP | 0 987 774 | 3/2000 | |
| EP | 0 991 129 | 5/2000 | |
| EP | 1 063 317 | 12/2000 | |
| EP | 1 115 160 | 11/2001 | |
| EP | 1 174 397 | 1/2002 | |
| EP | 1 300 889 | 4/2003 | |
| EP | 1 343 176 | 9/2003 | |
| FR | 2551267 | 3/1985 | |
| FR | WO 2006/024809 | * 3/2006 | |
| GB | 2188924 | 10/1987 | |
| JP | 61-141185 | 6/1986 | |
| JP | 61-278171 | 12/1986 | |
| JP | 62-179165 | 6/1987 | |
| JP | 02-106978 | 4/1990 | |
| JP | 2164077 | 6/1990 | |

(56) References Cited

FOREIGN PATENT DOCUMENTS

| JP | 7122764 | 5/1995 |
|----|---------|--------|
| JP | 11-298030 | 10/1999 |
| WO | WO 94/25397 | 11/1994 |
| WO | WO 03/019598 | 3/2003 |
| WO | WO 2006/029073 | 3/2006 |
| WO | WO 2008/036769 | 3/2008 |
| WO | WO 2008/063305 | 5/2008 |
| WO | WO 2008/154128 | 12/2008 |

OTHER PUBLICATIONS

Jain et al., "Ban Gap Widening and Narrowing in Moderately and Heavily Doped n—ZnO Films", Solid-State Electronics, vol. 50, pp. 1420-1424, 2006.
Kaur et al., "Physical Properties of Natively Textured Yttrium Doped Zinc Oxide Films by Sol-Gel", Journal of Materials Science: Materials in Electronics, vol. 16, pp. 649-655, 2005.
Minami et al., "Highly Transparent and Conductive Rare Earth Doped ZnO Thin Films Prepared by Magnetron Sputtering", Kanazawa Institute of Technology, Thin Solid Films, vol. 366, pp. 63-68, 2000.
Cap et al., The Band Structure and Work Function of Transparent Conducting Aluminum and Maganese Co-Doped Zinc Oxide Films, ACTA Metallurgica Sinica (English Letters), vol. 18, No. 3, pp. 356-362, 2005.
"Physical Properties of Natively Textured Yttrium Doped Zinc Oxide Films by Sol-Gel", Kaur et al., Journal of Materials Science: Materials in Electronics 16 (2005) pp. 649-655.
Japan Display' 89, Soda Lime Glass as a Substrate for TFT-LCDs, Uchikoga et al., pp. 426-429, International Display Research Conference.
"Numerical Modelling of Rear Junction SI Solar Cells Using Fermi-Dirac Statistics", Harder et al., FEIT-Engineering Australian National University, ACT 0200 (4pgs).
"Large-Area Deposition for Crystalline Silicon on Glass Modules", Basore, $3^{rd}$ World Conference on Photovoltaic Energy Conversion, May 2003, (pp. 1-4).
"Al-Doped Zinc Oxide Films Deposited by Simultaneous fr and dc Excitation of a Magnetron Plasma: Relationships Between Plasma Parameters and Structural and Electrical Film Properties", Cebulla et al., J.Appl. Phys. 83 (2), Jan. 15, 1998.
"Novel Device Structure for Cu(In, Ga)Se2 Thin film Solar Cells Using Transparent Conducting Oxide Back and Front Contacts", Nakada et al., Solar Energy 77 (2004) 739-747.
"Improvement in Quantum Efficiency of Thin Film Si Solar Cells Due to the Suppression of Optical Reflectance at Transparent Conducting Oxide/Si Interface by Ti02/ZnO Antireflection Coating", Fujibayashi et al., Applied Physics Letters 88, (2006) (2pgs).
"Thin-Film Compound Semiconductor Photovoltaics", Shafarman et al., Materials Research Society, vol. 865, Mar. 29-Apr. 1, 2005.
"Improved Three-Dimensional Optical Model for Thin-Film Silicon Solar Cells", Springer et al., Journal of Applied Physics, vol. 96, No. 9, Nov. 1, 2004.
U.S. Appl. No. 11/600,912, filed Nov. 17, 2006.
"TCO and Light Trapping in Silicon Thin Film Solar Cells". Muller et al., Solar Energy 77 (2004) pp. 917-930.
Mathew, Xavier et al. "CdTe/CdS solar cells on flexible substrates", Solar Energy 77 (2004) 831-838.
"A Transparent Metal: Nb-Doped Anatase TiO2", Furubayashi et al., Applied Physics Letters 86, (2005).
New Transparent Conductors Anatase Til-xMxO2 (M=Nb, Ta): Transport and Optical Properties, Furubayashi et al., Materials Research Society, vol. 905E, 2006.
"Transparent Conductors and Barrier Layers for Thin Film Solar Cells", Gordon et al., Final Technical Report Jun. 15, 2001.

"TiO2-Coated TCO (SnO2:F) Films Prepared by AP-CVD with High Durability against Hydrogen Radicals". Kambe et al., $15^{th}$ International Photovoltaic Science & Engineering Conference (PVSEC 15) China 2005.
"Self-Aligning, Industrially Feasible Back Contacted Silicon Solar Cells with Efficiencies >18%", Muller et al., $3^{rd}$ World Conference on Photovoltaic Energy Conversion, May 11-18, 2003, Osaka, Japan.
"Role of the Glass/TCO Substrate in Thin film Silicon Solar Cells", Muller et al., WCPEC-3, Psaka, Japan, May 11-18, 2003.
"Enhancement of Light Trapping in Silicon Thin-Film Solar Cells by Optimizing From TCO and Back Reflector", Jeon et al. $15^{th}$ Int. Photovoltaic Science & Engineering Conference, China, 2005.
"Recent Applications of Pulsed Lasers in Advanced Materials Processing", Booth, Thin Solid Films 453-454 (2004) pp. 450-457.
"Improved Fill Factors in Amorphous Silicon Solar Cells on Zinc Oxide by Insertion of a Germanium Layer to Block Impurity Incorporation", Ganguly et al., Applied Physics Letters, vol. 85, No. 3, Jul. 19, 2004, pp. 479-481.
"Improved Transparent Conductive Oxide/p+/i Junction in Amorphous Silicon Solar Cells by Tailored Hydrogen Flux During Growth", Nuruddin et al., Thin Solid Films 394 (2001) pp. 49-63.
"Work Function Determination of Zinc Oxide Films", Sundaram et al., J. Vac. Sci. Technol. A. 15(2), Mar./Apr. 1997, pp. 428-430.
"Optoelectronic Properties of Thin Amorphous and Micro-Crystalline P-Type Films Developed for Amorphous Silicon-Based Solar Cells", Winz et al., Materials Research Society Symposium Proceedings vol. 420, Apr. 1996.
"Investigation of Indium Tin Oxide/Zinc Oxide Multilayer Ohmic Contacts to n-Type GaN Isotype Conjunction", Lee et al., Applied Physics Letters, vol. 78, No. 22, May 28, 2001, pp. 3412-3414.
"The Insert of Zinc Oxide Thin Film in Indium Tin Oxide Anode for Organic Electroluminescence Devices", Jeong et al., Current Applied Physics 4 (2004) 655-658.
U.S. Appl. No. 11/509,094, filed Aug. 24, 2006.
"TiN and TiO2:Nb Thin Film Preparation Using Hollow Cathode Sputtering with Application to Solar Cells", Guo et al., J. Vac. Sci. Technol. A 24(4) (Jul./Aug. 2006) pp. 1529 Title Author journal volume page.
"Physical and Photoelectrochemical Properties of the TiO2—ZnO System", Yoon et al., Materials Research Bulletin, vol. 34, No. 9 (1999) pp. 1451-1461.
"Transparent Conducting Oxides (TCO's) for Amorphous Silicon Solar Cells", Hegedus et al., AIP Conf. Proc. vol. 353, No. 1 (1996) pp. 465-472.
"TiO2 Thin Films as Protective Material for Transparent-Conducting Oxides Used in Si Thin Film Solar Cells", Natsuhara et al., Solar Energy Materials & Solar Cells 90 (2006) pp. 2867-2880.
"Texture Etched ZnO:Al Coated Glass Substrates for Silicon Based Thin Film Solar Cells", Kluth et al., Thin Solid Films 351 (1999) pp. 247-253.
U.S. Appl. No. 11/507,660, filed Aug. 22, 2006.
U.S. Appl. No. 11/591,668, filed Nov. 2, 2006.
U.S. Appl. No. 11/591,676, filed Nov. 2, 2006.
U.S. Appl. No. 11/653,431, filed Jan. 16, 2007.
U.S. Appl. No. 11/717,787, filed Mar. 14, 2007.
U.S. Appl. No. 11/790,687, filed Apr. 26, 2007.
U.S. Appl. No. 11/790,812, filed Apr. 27, 2007.
U.S. Appl. No. 11/812,078, filed Jun. 14, 2007.
U.S. Appl. No. 11/808,765, filed Jun. 12, 2007.
U.S. Appl. No. 11/898,641, filed Sep. 13, 2007.
U.S. Appl. No. 11/984,092, filed Nov. 13, 2007.
U.S. Appl. No. 11/987,664, filed Dec. 3, 2007.
U.S. Appl. No. 11/984,662, filed Nov. 20, 2007.
U.S. Appl. No. 12/068,117, filed Feb. 1, 2008.
U.S. Appl. No. 12/068,119, filed Feb. 1, 2008.
U.S. Appl. No. 12/149,263, filed Apr. 29, 2008.
U.S. Appl. No. 12/232,619, filed Sep. 19, 2008.
U.S. Appl. No. 12/285,374, filed Oct. 2, 2008.
U.S. Appl. No. 12/285,890, filed Oct. 15, 2008.

* cited by examiner

LOW-E COATING HAVING ZINC ALUMINUM OXIDE BASED LAYER DOPED WITH YTTRIUM

This application is a divisional of application Ser. No. 11/650,564 filed Jan. 8, 2007, the entire disclosure of which is hereby incorporated herein by reference in this application.

Certain example embodiments of this invention relate to an electrode (e.g., front electrode) for use in a photovoltaic device or the like. In certain example embodiments, a transparent conductive oxide (TCO) based front electrode for use in a photovoltaic device is of or includes zinc oxide, or zinc aluminum oxide, doped with yttrium (Y). In certain example embodiments, the addition of the yttrium (Y) to the conductive zinc oxide or zinc aluminum oxide is advantageous in that potential conductivity loss of the electrode can be reduced or prevented, for example at high processing temperatures. Moreover, in certain example embodiments of this invention, the electrode (e.g., $ZnO_X$:Y or $ZnAlO_X$:Y) may be sputter-deposited in a non-stoichiometric oxygen deficient form.

BACKGROUND AND SUMMARY OF EXAMPLE EMBODIMENTS OF INVENTION

Photovoltaic devices are known in the art (e.g., see U.S. Pat. Nos. 6,784,361, 6,288,325, 6,613,603 and 6,123,824, the disclosures of which are hereby incorporated herein by reference). Amorphous silicon (a-Si) and CdTe type photovoltaic devices, for example, each include a front contact or electrode. Typically, the front electrode is made of a transparent conductive oxide (TCO) such as tin oxide or zinc oxide formed on a substrate such as a glass substrate. Accordingly, it will be appreciated that zinc oxide doped with Al ($ZnAlO_X$) is a known TCO material for use as an electrode for a photovoltaic device. In certain applications, such as CdTe photovoltaic devices as an example, high processing temperatures (e.g., 550-600 degrees C.) are used during manufacturing. Zinc oxide is also used in applications such as low-E coatings to support IR reflecting layers which may be made of silver or the like.

Unfortunately, conductive $ZnAlO_X$ tends to lose a significant amount of its electrical conductivity when heated above about 400 degrees C. This loss of conductivity may be caused by fast oxygen migration from grain boundaries into the bulk of the crystallites. At even higher temperatures (e.g., 625-650 degrees C.), structural transformation of zinc oxide starts to occur, which is particularly disadvantageous for applications such as heat treatable low-E coatings because it compromises the integrity and corrosion resistance of IR reflecting films that are often formed directly on and over the zinc oxide; such a transformation may be detected for instance by an increased <002>/<103> XRD peak ratio.

It is apparent from the above that there exists a need in the art for an improved TCO material. In certain example embodiments of this invention, there exists a need in the art for a zinc oxide, or zinc aluminum oxide, based TCO that has a reduced potential for significant conductivity loss at high temperatures (e.g., above about 400 degrees C., or possibly even higher). In certain example embodiments of this invention, there exists a need in the art for a zinc oxide, or zinc aluminum oxide, based TCO that has a reduced likelihood of structural transformation at high temperatures. Such improved TCO materials may be used in various applications, including but not limited to electrodes (e.g., front electrodes) in photovoltaic devices, as silver-supporting layers in low-E coatings, and the like.

It has been found that by doping a zinc oxide, or zinc aluminum oxide, based TCO with small amounts of yttrium (Y), the TCO can be improved in one or more respects. For example, by doping a zinc oxide, or zinc aluminum oxide, based TCO with a small amount of yttrium (Y), the resulting TCO can realize a reduced conductivity loss at high temperatures. As another example, by doping a zinc oxide, or zinc aluminum oxide, based film (which is a TCO in certain preferred instances, but need not be in all cases) with a small amount of yttrium (Y), the resulting film can realize reduced or no structural transformation at high temperatures (e.g., of at least about 400 degrees C., or even possibly of at least about 550, 600 or 625 degrees C.).

In certain example embodiments, a transparent conductive oxide (TCO) based front electrode for use in a photovoltaic device is of or includes zinc oxide, or zinc aluminum oxide, doped with yttrium (Y). In certain example embodiments, the addition of the yttrium (Y) to the conductive zinc oxide or zinc aluminum oxide is advantageous in that potential conductivity loss of the electrode can be reduced or prevented. As used herein, the term "yttrium" includes and covers both metallic yttrium, as well as yttrium oxide such as $Y_2O_3$ or any other suitable stoichiometry.

Moreover, in certain example embodiments of this invention, the electrode (e.g., $ZnO_X$:Y or $ZnAlO_X$:Y) may be sputter-deposited in a non-stoichiometric oxygen deficient form, or may be deposited in any other suitable manner. Sputtering at approximately room temperature may be used for the deposition of the electrode in certain example instances, although other techniques may instead be used in certain instances. For example, the electrode may be sputter-deposited using a ceramic target(s) made of $ZnO_X$ or $ZnAlO_X$ doped with Y and/or $Y_2O_3$. Alternatively, the electrode may be sputter-deposited in an oxygen gas (and possibly argon gas, or any other suitable gas) inclusive atmosphere using a metal or substantially metal target(s) made of Zn or ZnAl doped with Y; the gas composition or mixture may be chosen so as to make the initially deposited material substoichiometric in certain example instances.

In certain example embodiments, the electrode of or including $ZnO_X$:Y and/or $ZnAlO_X$:Y may be used as any suitable electrode in any suitable electronic device, such as a photovoltaic device, a flat-panel display device, and/or an electro-optical device.

In certain example embodiments of this invention, the TCO (e.g., $ZnO_X$:Y or $ZnAlO_X$:Y) electrode or film may have a sheet resistance ($R_S$) of from about 7-50 ohms/square, more preferably from about 10-25 ohms/square, and most preferably from about 10-15 ohms/square using a reference example non-limiting thickness of from about 1,000 to 2,000 angstroms, although other thicknesses are possible, especially smaller thicknesses may be used in low-E applications.

Sputter deposition of a TCO (transparent conductive oxide) at approximately room temperature for a front electrode in a photovoltaic device would be desirable, given that most float glass manufacturing platforms are not equipped within-situ heating systems. Moreover, an additional potential advantage of sputter-deposited TCO films is that they may include the integration of anti-reflection coatings, resistivity reduction, and so forth. For example, a single or multi-layer anti-reflection coating may be provided between the glass substrate and the TCO front electrode in photovoltaic applications. As another example, a silver based IR reflecting layer may be sputter-deposited over the $ZnO_X$:Y or $ZnAlO_X$:Y in low-E coating applications.

In certain example embodiments of this invention, there is provided a photovoltaic device comprising: a front glass substrate; a semiconductor film; an electrically conductive and substantially transparent front electrode located between at least the front glass substrate and the semiconductor film; and wherein the front electrode comprises zinc oxide and/or zinc aluminum oxide, doped with from about 0.001 to 5.0% yttrium.

In other example embodiments of this invention, there is provided an electrode structure for use in an electronic device, the electrode structure comprising: a substrate; an electrically conductive and substantially transparent electrode supported by at least the substrate; and wherein the electrode comprises zinc oxide and/or zinc aluminum oxide, doped with from about 0.001 to 5.0% yttrium In still further example embodiments of this invention, there is provided a coated article comprising: a low-E coating supported by a glass substrate; the low-E coating comprises at least one IR reflecting layer, with the IR reflecting layer being provided over a layer comprising zinc oxide and/or zinc aluminum oxide, the layer comprising zinc oxide and/or zinc aluminum oxide being doped with yttrium.

DETAILED DESCRIPTION OF EXAMPLE EMBODIMENTS OF THE INVENTION

Figure 1:
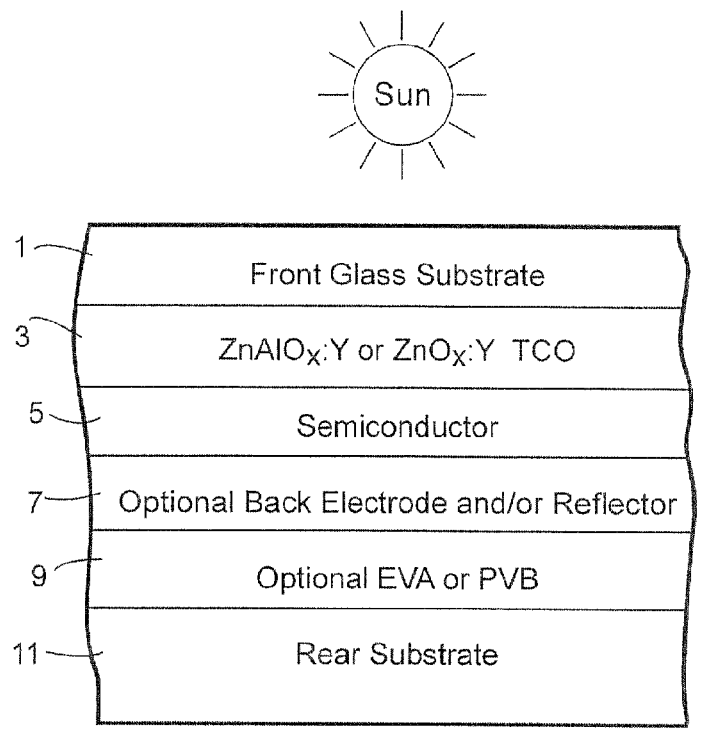
FIG. 1 is a cross sectional view of an example photovoltaic device according to an example embodiment of this invention.

Referring now more particularly to the drawings in which like reference numerals indicate like parts throughout the several views.

Photovoltaic devices such as solar cells convert solar radiation and other light into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers, or any other suitable semiconductor material) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers which make up a semiconductor film. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, tandem thin-film solar cells, and the like.

Certain example embodiments of this invention may be also be applicable to CdS/CdTe type photovoltaic devices, especially given the high processing temperatures often utilized in making CdTe type photovoltaic devices. Moreover, electrodes according to different embodiments of this invention may also be used in connection with CIS/CIGS and/or tandem a-Si type photovoltaic devices.

FIG. 1 is a cross sectional view of a photovoltaic device according to an example embodiment of this invention. The photovoltaic device includes transparent front glass substrate 1, front electrode or contact 3 which is of or includes a TCO such as $ZnO_X{:}Y$ and/or $ZnAlO_X{:}Y$, active semiconductor film 5 of one or more semiconductor layers, optional back electrode or contact 7 which may be of a TCO or a metal, an optional encapsulant 9 or adhesive of a material such as ethyl vinyl acetate (EVA), polyvinyl butyral (PVB), or the like, and an optional rear substrate 11 of a material such as glass. The semiconductor layer(s) of film 5 may be of a-Si or another other suitable material. Of course, other layer(s) which are not shown may be provided in the device, such as between the front glass substrate 1 and the front contact 3, or between other layers of the device.

It has been found that by doping a zinc oxide, or zinc aluminum oxide, based TCO electrode 3 with small amounts of yttrium (Y), the TCO layer 3 can be improved in one or more respects. For example, by doping a zinc oxide, or zinc aluminum oxide based electrode 3 with a small amount of yttrium (Y), the resulting electrode 3 can realize a reduced conductivity loss at high temperatures. As another example, by doping zinc oxide, or zinc aluminum oxide, based electrode 3 with a small amount of yttrium (Y), the resulting electrode can realize reduced or no structural transformation at high temperatures (e.g., of at least about 400 degrees C., or even possibly of at least about 550, 600 or 625 degrees C.). Thus, in certain example embodiments, a transparent conductive oxide (TCO) based front electrode 3 is of or includes zinc oxide, or zinc aluminum oxide, doped with yttrium (Y). In certain example embodiments, the addition of the yttrium (Y) to the conductive zinc oxide or zinc aluminum oxide-based electrode 3 is advantageous in that potential conductivity loss of the electrode 3 can be reduced or prevented if exposed to high temperatures. The substantially transparent electrode 3 has a visible transmission of at least about 50%, more preferably of at least about 60%, even more preferably of at least about 70% or 80%, in certain example embodiments of this invention.

In certain example embodiments of this invention, the electrode (e.g., $ZnO_X{:}Y$ or $ZnAlO_X{:}Y$) 3 may be sputter-deposited in a non-stoichiometric oxygen deficient form, or may deposited in any other suitable manner, on glass or plastic substrate 1. Sputtering at approximately room temperature may be used for the deposition of the electrode 3 in certain example instances, although other techniques may instead be used in certain instances. For example, the electrode 3 may be sputter-deposited using a ceramic target(s) made of $ZnO_X$ or $ZnAlO_X$ doped with Y and/or $Y_2O_3$. Alternatively, the electrode 3 may be sputter-deposited in an oxygen gas (and possibly argon gas, or any other suitable gas) inclusive atmosphere using a metal or substantially metal target(s) made of Zn or ZnAl doped with Y; the gas composition or mixture may be chosen so as to make the initially deposited material substoichiometric in certain example instances.

In certain example embodiments of this invention, the TCO (e.g., $ZnO_X$:Y or $ZnAlO_X$:Y) electrode or film 3 may have a sheet resistance ($R_S$) of from about 7-50 ohms/square, more preferably from about 10-25 ohms/square, and most preferably from about 10-15 ohms/square using a reference example non-limiting thickness of from about 1,000 to 2,000 angstroms, although other thicknesses are possibly especially smaller thicknesses in low-E applications.

In certain example embodiments of this invention, the $ZnO_X$:Y and/or $ZnAlO_X$:Y electrode or film 3 contains from about 0.001 to 5.0% yttrium, more preferably from about 0.005 to 1.0% yttrium, even more preferably from about 0.01 to 0.10% yttrium, still more preferably from about 0.01 to 0.02% yttrium (by weight %). In a similar manner, the ZnY, ZnAlY, $ZnO_X$:Y and/or $ZnAlO_X$:Y sputtering target(s) used to sputter-deposit the electrode or film 3 may contain from about 0.001 to 5.0% yttrium, more preferably from about 0.005 to 1.0% yttrium, even more preferably from about 0.01 to 0.50% yttrium, still more preferably from about 0.05 to 0.20% yttrium (by wt. %). It has been found that the presence of yttrium in these amounts is highly effective at reducing conductivity loss and/or structural transformation of the electrode 3 up exposure to high temperatures such as at least about 400 degrees C., possibly at least about 550, 600 or 625 degrees C. It is noted that such yttrium content may be used in connection with the films and targets in connection with each of the FIG. 1-4 embodiments, in connection with certain example embodiments of this invention.

Moreover, in certain example embodiments of this invention, the $ZnO_X$:Y and/or $ZnAlO_X$:Y electrode or film 3 contains from about 0 to 10% Al, more preferably from about 0.5 to 7% Al, and sometimes from about 1 to 4% Al. In certain example embodiments of this invention, the $ZnO_X$:Y and/or $ZnAlO_X$:Y electrode or film 3 contains from about 10-75% Zn, more preferably from about 20-70% Zn, and possibly from about 30-65% Zn. In certain example embodiments, $ZnO_X$:Y and/or $ZnAlO_X$:Y electrode or film 3 contains more zinc than yttrium, more preferably at least twice or three times as much zinc as yttrium. Moreover, in certain example embodiments, conductive $ZnO_X$:Y and/or $ZnAlO_X$:Y electrode or film 3 may contain more aluminum than yttrium, possibly at least twice or three times as much aluminum as yttrium.

In certain example embodiments of this invention, the TCO front electrode or contact 3 is substantially free, or entirely free, of fluorine. This may be advantageous for pollutant issues. In certain example embodiments of this invention, the TCO front electrode 3 before and/or after the heat treatment may have a sheet resistance ($R_S$) of from about 7-50 ohms/square, more preferably from about 10-25 ohms/square, and most preferably from about 10-15 ohms/square using a reference example non-limiting thickness of from about 1,000 to 2,000 angstroms, so as to ensure adequate conductivity.

An additional potential advantage of sputter-deposited TCO films for front electrodes/contacts 3 is that they may permit the integration of an anti-reflection and/or colour-compression coating (not shown) between the front electrode 3 and the glass substrate 1. The anti-reflection coating (not shown) may include one or multiple layers in different embodiments of this invention. For example, the anti-reflection coating may include a high refractive index dielectric layer immediately adjacent the glass substrate 1 and another layer of a lower refractive index dielectric immediately adjacent the front electrode 3. Thus, since the front electrode 3 is on the glass substrate 1, it will be appreciated that the word "on" as used herein covers both directly on and indirectly on with other layers therebetween.

Front glass substrate 1 and/or rear substrate 11 may be made of soda-lime-silica based glass in certain example embodiments of this invention. While substrates 1, 11 may be of glass in certain example embodiments of this invention, other materials such as quartz or the like may instead be used. Like electrode 3, substrate 1 may or may not be patterned in different example embodiments of this invention. Moreover, rear substrate or superstrate 11 is optional in certain instances. Glass 1 and/or 11 may or may not be thermally tempered in different embodiments of this invention.

The active semiconductor region or film 5 may include one or more layers, and may be of any suitable material. For example, the active semiconductor film 5 of one type of single junction amorphous silicon (a-Si) photovoltaic device includes three semiconductor layers, namely a p-layer, an n-layer and an i-layer. These amorphous silicon based layers of film 5 may be of hydrogenated amorphous silicon in certain instances, but may also be of or include hydrogenated amorphous silicon carbon or hydrogenated amorphous silicon germanium, or other suitable material(s) in certain example embodiments of this invention. It is possible for the active region 5 to be of a double-junction type in alternative embodiments of this invention.

Back contact, reflector and/or electrode 7 of the photovoltaic device may be of any suitable electrically conductive material. For example and without limitation, the optional back contact or electrode 7 may be of a TCO and/or a metal in certain instances. Example TCO materials for use as back contact or electrode 7 include indium zinc oxide, indium-tin-oxide (ITO), tin oxide, and/or zinc oxide which may be doped with aluminum (which may or may not be doped with silver). It is possible that the optional rear electrode 7 be made of the same or similar $ZnO_X$:Y and/or $ZnAlO_X$:Y material discussed herein with respect to electrode 3, in certain example embodiments of this invention. The TCO of the back electrode 7 may be of the single layer type or a multi-layer type in different instances. Moreover, the back electrode or contact 7 may include both a TCO portion and a metal portion in certain instances. For example, in an example multi-layer embodiment, the TCO portion of the back contact 7 may include a layer of a material such as indium zinc oxide (which may or may not be doped with silver, or the like), indium-tin-oxide (ITO), $ZnO_X$:Y and/or $ZnAlO_X$:Y, tin oxide, and/or zinc oxide closest to the active region 5, and another conductive and possibly reflective layer of a material such as silver, molybdenum, platinum, steel, iron, niobium, titanium, chromium, bismuth, antimony, or aluminum further from the active region 5 and closer to the substrate 11. The metal portion may be closer to substrate 11 compared to the TCO portion of the back contact/electrode 7.

The photovoltaic module may be encapsulated or partially covered with an encapsulating material such as encapsulant 9 in certain example embodiments. An example encapsulant or adhesive for layer 9 is EVA. However, other materials such as PVB, Tedlar type plastic, Nuvasil type plastic, Tefzel type plastic or the like may instead be used for layer 9 in different instances.

Figure 2:
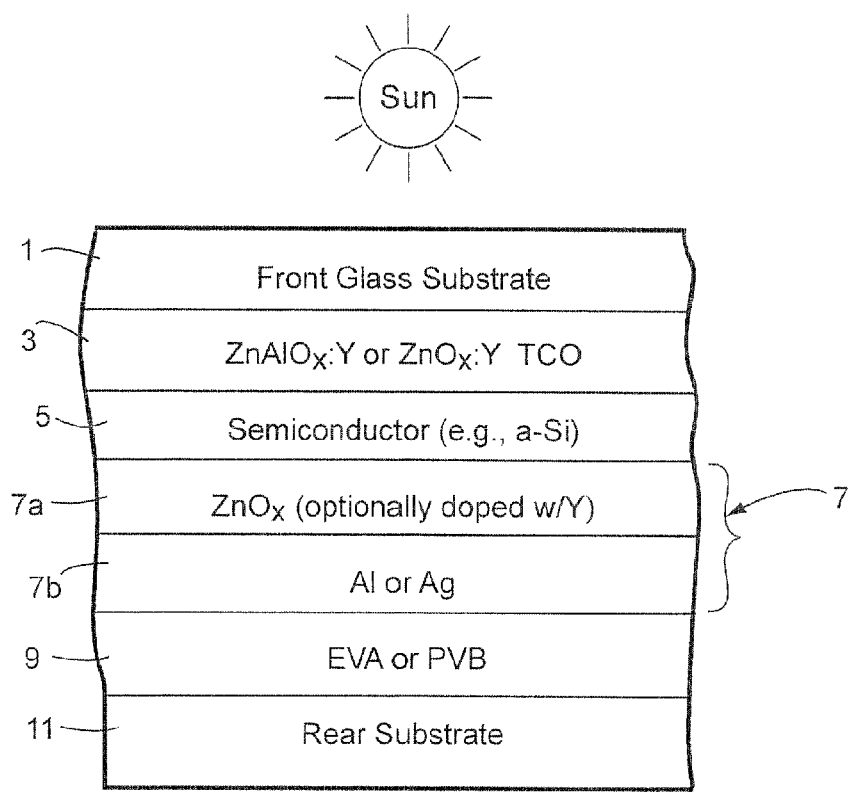
FIG. 2 is a cross sectional view of an example photovoltaic device according to another example embodiment of this invention.

FIG. 2 is a cross sectional view of a photovoltaic device according to another example embodiment of this invention. The device of FIG. 2 is similar to that of FIG. 1, except that the rear electrode/reflector 7 is illustrated in FIG. 2 as including both a TCO portion 7a and a metal portion 7b. For example, in an example multi-layer embodiment, the TCO portion 7a of the back electrode 7 may include a layer 7a of a material such as indium zinc oxide (which may or may not be doped with silver, or the like), indium-tin-oxide (ITO), $ZnO_X$:Y and/or $ZnAlO_X$:Y, tin oxide, and/or zinc oxide closest to the active region 5, and another conductive and possibly reflective layer 7b of a material such as silver, molybdenum, platinum, steel, iron, niobium, titanium, chromium, bismuth, antimony, or aluminum further from the active region 5 and closer to the substrate 11.

Figure 3:
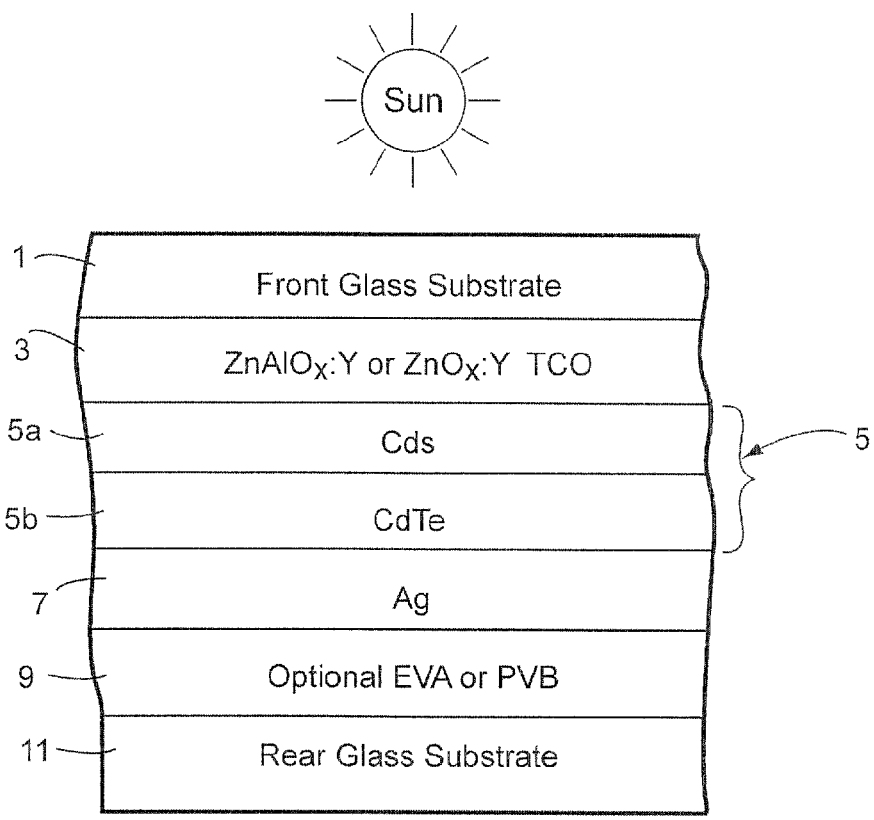
FIG. 3 is a cross sectional view of an example photovoltaic device according to another example embodiment of this invention.

FIG. 3 is a cross sectional view of a CdTe type photovoltaic device according to another example embodiment of this invention. The device of FIG. 3, in this particular example, is similar to that of FIGS. 2-3 except that the semiconductor film 5 is shown as including both a CdS inclusive or based layer 5a and a CdTe inclusive or based layer 5b, and silver is used as an example material for the rear electrode or reflector 7 in this example.

Figure 4:
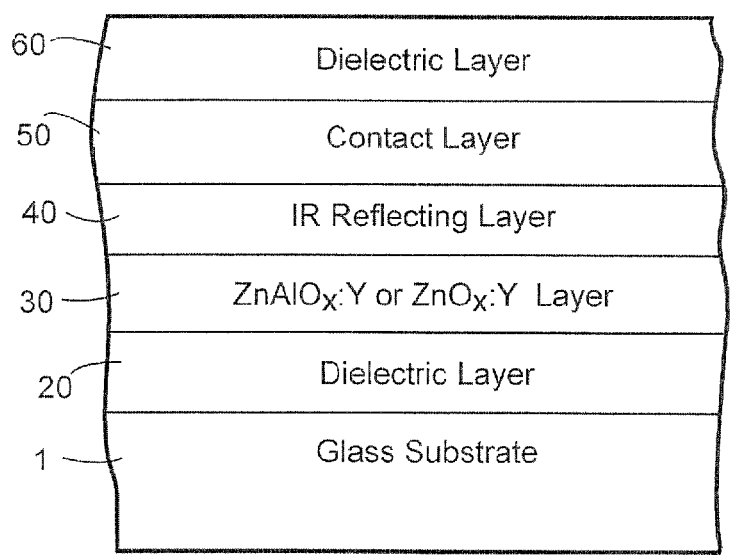
FIG. 4 is a cross sectional view of a coated article with a low-E (low emissivity) coating thereon according to an example embodiment of this invention.

FIG. 4 is an example of a coated article including a low-emissivity (low-E) coating on a glass substrate 1. The glass substrate 1 may be thermally tempered in certain example embodiments of this invention. Example low-E coatings are disclosed in U.S. Pat. Nos. 6,686,050, 7,153,579, 7,090,921, and 6,936,347, the disclosures of which are all hereby incorporated herein by reference. A low-E coating typically includes at least one IR reflecting layer of or including an IR (infrared) reflecting material such as Ag, Au or the like, where the IR reflecting layer is sandwiched between at least first and second dielectric layers or the like. In the FIG. 4 embodiment, the low-E coating includes on glass substrate 1, at least: dielectric layer 20 of a material such as silicon nitride or any other suitable dielectric, layer 30 of or including $ZnO_X$:Y and/or $ZnAlO_X$:Y, IR reflecting layer 40 of or including Ag, Au or the like, contact layer 50 that directly contacts the IR reflecting layer (the contact layer may be made of a metal or metal oxide such as NiCrOx, zinc oxide, or the like), and dielectric layer 60 of or including a material such as silicon nitride or the like. Of course other materials may be used for these layers 20, 40, 50 and 60, one or more of these layers may be deleted, and/or other layers may be added. The $ZnO_X$:Y and/or $ZnAlO_X$:Y based layer 30 is the same as layer 3 in FIGS. 1-3, except that $ZnO_X$:Y and/or $ZnAlO_X$:Y based layer 30 may or may not be conductive, and may have a thickness of from about 50-500 angstroms, more preferably from about 70-200 angstroms in certain low-E coating applications. The coated article of FIG. 4 may, for example, have a visible transmission of at least about 40%, more preferably of at least about 50%, 60%, or 70%, and may have a sheet resistance ($R_S$) of no more than about 20 ohms/square, more preferably no more than about 10, 8, or 6 ohms/square, in certain example embodiments of this invention. The coated article of FIG. 4 may be used as a vehicle window, or as a window or part of a window in a building, where the IR reflecting layer blocks significant amounts of IR radiation in the window.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article comprising:
   a low-E coating supported by a glass substrate;
   the low-E coating comprises at least one IR reflecting layer, the IR reflecting layer being provided over a dielectric layer comprising zinc aluminum oxide, the layer comprising zinc aluminum oxide being doped with yttrium, wherein the dielectric layer comprising zinc aluminum oxide comprises from about 0.05 to 0.20% yttrium (by wt. %), and wherein the layer comprising zinc aluminum oxide doped with yttrium comprises at least twice as much aluminum as yttrium by weight; and
   wherein the low-E coating has a sheet resistance of no more than about 10 ohms/square.

2. The coated article of claim 1, wherein the layer comprising zinc aluminum oxide contains from 0.5 to 7% Al.

3. The coated article of claim 1, wherein the IR reflecting layer is located over and directly contacting the layer comprising zinc aluminum oxide doped with yttrium.

4. The coated article of claim 1, wherein the layer comprising zinc aluminum oxide contains from about 1 to 4% Al.

5. The coated article of claim 1, wherein the IR reflecting layer comprises Ag and the coated article has a visible transmission of at least about 50%.

6. The coated article of claim 1, wherein the coated article is used in a window in a building or vehicle.

7. The coated article of claim 1, wherein the IR reflecting layer is provided over and directly contacting the dielectric layer comprising zinc aluminum oxide doped with yttrium, wherein the layer comprising zinc aluminum oxide comprises from about 0.5 to 7% aluminum.

* * * * *